(12) United States Patent
Wang et al.

(10) Patent No.: US 11,398,105 B2
(45) Date of Patent: Jul. 26, 2022

(54) ULTRASONIC RECOGNITION MODULE, DRIVING METHOD THEREOF, AND DISPLAY DEVICE

(71) Applicant: BOE Technology Group Co., Ltd., Beijing (CN)

(72) Inventors: Pengpeng Wang, Beijing (CN); Haisheng Wang, Beijing (CN); Xiaoliang Ding, Beijing (CN); Yingming Liu, Beijing (CN); Yangbing Li, Beijing (CN); Yubo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 195 days.

(21) Appl. No.: 16/839,211

(22) Filed: Apr. 3, 2020

(65) Prior Publication Data

US 2021/0056278 A1 Feb. 25, 2021

(30) Foreign Application Priority Data

Aug. 21, 2019 (CN) .......................... 201910772744.8

(51) Int. Cl.
*G06K 9/28* (2006.01)
*G06V 40/13* (2022.01)
*H03K 17/687* (2006.01)

(52) U.S. Cl.
CPC ....... *G06V 40/1306* (2022.01); *H03K 17/687* (2013.01)

(58) Field of Classification Search
CPC .......................... G06K 9/0002; G06V 40/1306
See application file for complete search history.

(56) References Cited

U.S. PATENT DOCUMENTS

| 2015/0016223 | A1* | 1/2015 | Dickinson | ............. | G06F 3/0436 367/87 |
| 2016/0117541 | A1* | 4/2016 | Lu | ........................ | G06K 9/0002 382/124 |

(Continued)

FOREIGN PATENT DOCUMENTS

| CN | 106959782 A | 7/2017 |
| CN | 108335680 A | 7/2018 |

(Continued)

OTHER PUBLICATIONS

Tang et al., "3-D Ultrasonic Fingerprint Sensor-on-a-Chip", IEEE Journal of Solid-State Circuits, vol. 51, No. 11, Nov. 2016, pp. 2522-2533. (Year: 2016).*

(Continued)

*Primary Examiner* — Brian Werner
(74) *Attorney, Agent, or Firm* — ArentFox Schiff LLP; Michael Fainberg

(57) ABSTRACT

An ultrasonic recognition module, a driving method thereof, and a display device. Multiple receiving electrodes are divided into multiple receiving groups. Pulse signal input ends of driving circuits corresponding to the receiving electrodes in the same receiving group are electrically connected to a same pulse signal input line, and pulse signal input ends of driving circuits corresponding to the receiving electrodes in the different receiving groups are electrically connected to different pulse signal input lines.

18 Claims, 12 Drawing Sheets

(56) References Cited

U.S. PATENT DOCUMENTS

2017/0344778 A1* 11/2017 Lee .................... G06K 9/0002
2018/0189539 A1 7/2018 Chen
2019/0073068 A1 3/2019 Huang
2019/0370523 A1 12/2019 Gao et al.
2021/0019018 A1 1/2021 Guo et al.

FOREIGN PATENT DOCUMENTS

| CN | 108776789 A | 11/2018 |
|---|---|---|
| CN | 109754757 A | 5/2019 |
| CN | 109801597 A | 5/2019 |
| CN | 109829419 A | 5/2019 |
| WO | 2009148159 A1 | 12/2009 |

OTHER PUBLICATIONS

Office Action for corresponding Chinese Application 201910772744.8 dated Jul. 22, 2021.

* cited by examiner

ULTRASONIC RECOGNITION MODULE, DRIVING METHOD THEREOF, AND DISPLAY DEVICE

CROSS-REFERENCE TO RELATED APPLICATION

This application claims priority of Chinese Patent Application No. 201910772744.8, filed on Aug. 21, 2019, which is hereby incorporated by reference in its entirety.

FIELD

The present disclosure relates to the technical field of display, in particular to an ultrasonic recognition module, a driving method thereof, and a display device.

BACKGROUND

With continuous development of science and technologies, a fingerprint recognition technology has gradually been applied to people's daily life. In the fingerprint recognition technology, identification can be performed by comparing detailed feature points of different fingerprints to implement a function of identity identification. Generally, the fingerprint recognition technology can include an optical fingerprint recognition technology, a silicon chip fingerprint recognition technology, and an ultrasonic fingerprint recognition technology.

Currently, the ultrasonic fingerprint recognition technology is a popular research direction of major manufacturers. An ultrasonic fingerprint recognition structure is mainly a three-layer laminated structure, including a driving electrode, a receiving electrode, and a piezoelectric layer located between the two. When a driving voltage is applied to the driving electrode and the receiving electrode, the piezoelectric layer is excited by the voltage to generate an inverse piezoelectric effect and transmit a first ultrasonic wave to the outside. After the first ultrasonic wave contacts a finger, a second ultrasonic wave is reflected by the finger. Because the fingerprint includes valleys and ridges, there is variance in vibration intensity of the second ultrasonic wave reflected by the fingerprint back to the piezoelectric layer. In this case, when a fixed voltage is applied to the driving electrode, the piezoelectric layer can convert the second ultrasonic wave into a voltage signal. The voltage signal is transmitted to the fingerprint recognition module by the receiving electrode, and positions of the valleys and the ridges in the fingerprint are determined according to the voltage signal.

SUMMARY

An embodiment of the present disclosure provides an ultrasonic recognition module, including: a plurality of receiving electrodes arranged in an array and a plurality of driving circuits electrically connected to the plurality of receiving electrodes in a one-to-one correspondence mode, wherein the plurality of receiving electrodes are divided into a plurality of receiving groups, the plurality of driving circuits respectively includes a pulse signal input end, pulse signal input ends of the driving circuits corresponding to the receiving electrodes in the same receiving group are electrically connected to a same pulse signal input line, and the pulse signal input ends of the driving circuits corresponding to the receiving electrodes in the different receiving groups are electrically connected to different pulse signal input lines.

Optionally, in specific implementation, in the ultrasonic recognition module provided by the embodiment of the present disclosure, the receiving electrodes in a same row are located in the same receiving group, and the receiving electrodes in different rows are located in the different receiving groups.

Optionally, in specific implementation, in the ultrasonic recognition module provided by the embodiment of the present disclosure, the receiving electrodes in a same row are located in the same receiving group, and the receiving electrodes in different rows are located in the different receiving groups.

Optionally, in specific implementation, in the ultrasonic recognition module provided by the embodiment of the present disclosure, the plurality of driving circuits respectively include a diode, a first switch transistor, a second switch transistor, and a third switch transistor; wherein, a first end of the diode is electrically connected to a receiving electrode, and a second end of the diode is electrically connected to the pulse signal input end;

a gates of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, and a second pole of the second switch transistor is connected to a first pole of the third switch transistor, a gate of the third switch transistor is electrically connected to a scanning signal end, and a second pole of the third switch transistor is electrically connected to a signal reading end.

Optionally, in specific implementation, in the ultrasonic recognition module provided by the embodiment of the present disclosure, the driving circuits respectively include a storage capacitor, a first switch transistor, a second switch transistor, and a third switch transistor; wherein, a first end of the storage capacitor is electrically connected to the receiving electrode, and a second ends of the storage capacitor is grounded;

a gate of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, a second pole of the second switch transistor is electrically connected to a first pole of the third switch transistor, a gate of the third switch transistor is electrically connected to a scanning signal end, and a second pole of the third switch transistor is electrically connected to a signal reading end.

Optionally, in specific implementation, the ultrasonic recognition module provided by the embodiment of the present disclosure further includes: a driving electrode disposed opposite to a film layer where the plurality of receiving electrodes are located, and a piezoelectric layer located between the driving electrode and the film layer where the plurality of receiving electrodes are located, wherein the driving electrode and the piezoelectric layer are formed over an entire surface.

Correspondingly, an embodiment of the present disclosure further provides a display device, including the ultrasonic recognition module provided by the embodiment of the present disclosure.

Correspondingly, an embodiment of the present disclosure further provides a driving method of the ultrasonic recognition module provided by the embodiment of the present disclosure, including:

providing multiple detection points for by the ultrasonic recognition module, wherein each of the detection points corresponds to the plurality of receiving groups, and one receiving group corresponds to only one detection point; and applying pulse signals to pulse signal input ends of the plurality of receiving groups corresponding to a same detection point by using the pulse signal input lines, wherein time points for loading the pulse signals by receiving groups that are at a same distance from the detection point are same, and time points for loading the pulse signals by receiving groups that are closer to the detection point are later than time points for loading the pulse signals by receiving groups that are far from the detection point.

Optionally, in specific implementation, in the driving method of the ultrasonic recognition module provided by the embodiment of the present disclosure, the receiving electrodes located in a same row are a receiving group, or the receiving electrodes located in a same column are a receiving group.

Optionally, in specific implementation, in the driving method of the ultrasonic recognition module provided by the embodiment of the present disclosure, simultaneously performing a ultrasonic detection on detection points corresponding to the receiving groups which do not spatially cross.

Optionally, in specific implementation, in the driving method of the ultrasonic recognition module provided by the embodiment of the present disclosure, sequentially perform a ultrasonic detection is on detection points corresponding to the receiving groups which spatially cross.

Optionally, in specific implementation, in the driving method of the ultrasonic recognition module provided by the embodiment of the present disclosure, the sequentially performing the ultrasonic detection on the detection points, comprises:

receiving electrodes of the plurality of receiving groups corresponding to other detection points are in a floating state in response to that performing the ultrasonic detection one detection point.

Optionally, in specific implementation, in the driving method of the ultrasonic recognition module provided by the embodiment of the present disclosure, every two adjacent receiving groups correspond to the different detection points, and the receiving groups corresponding to the different detection points are alternately arranged.

Optionally, in specific implementation, in the driving method of the ultrasonic recognition module provided by the embodiment of the present disclosure, each detection point corresponds to an odd number of receiving groups, and the receiving group in the center location of the odd number of receiving groups is a first receiving group, the receiving groups on both sides of the first receiving group are second receiving groups, all the second receiving groups are symmetrically arranged along the first receiving group, and the detection point is located right above the first receiving group.

DETAILED DESCRIPTION OF THE EMBODIMENTS

Figure 1:
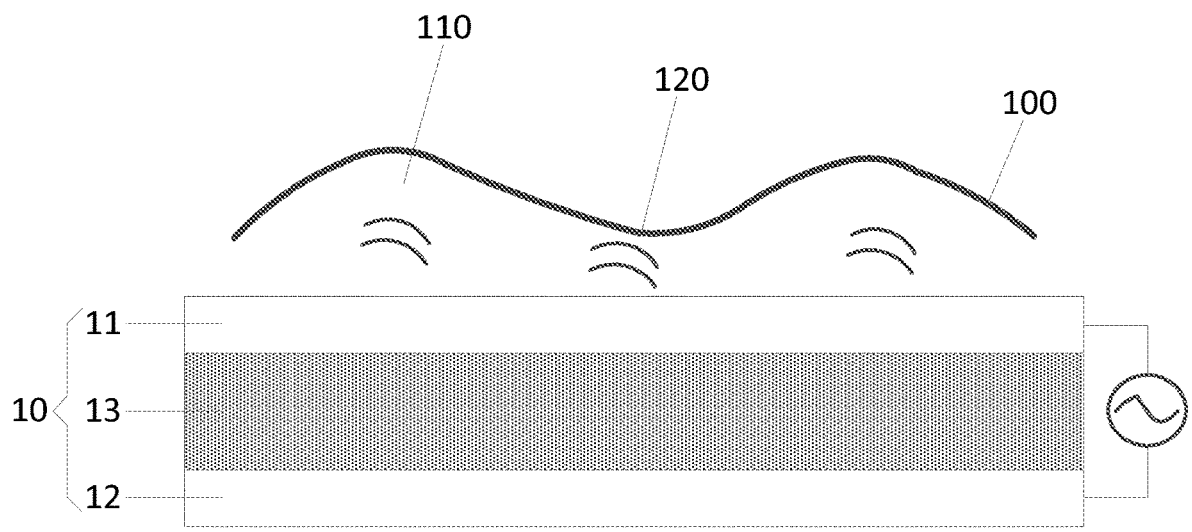
FIG. 1 is a schematic diagram of transmitting ultrasonic waves by an ultrasonic recognition module.

To make the objectives, technical solutions and advantages of the present disclosure clearer, specific implementations of an ultrasonic recognition module, a driving method thereof, and a display device provided by the embodiments of the present disclosure will be described in detail below with reference to the accompanying drawings.

The thickness and shape of each layer of film in the drawings do not reflect a true proportion of the ultrasonic recognition module, and the objective is only to schematically illustrate the content of the present disclosure.

Figure 2:
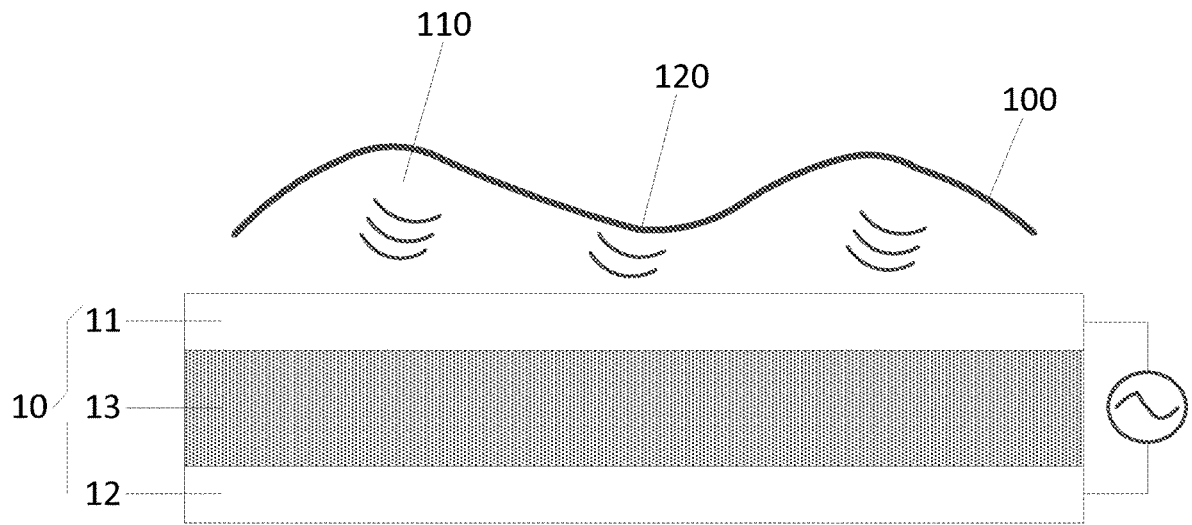
FIG. 2 is a schematic diagram of receiving ultrasonic waves by an ultrasonic recognition module.
Figure 3:
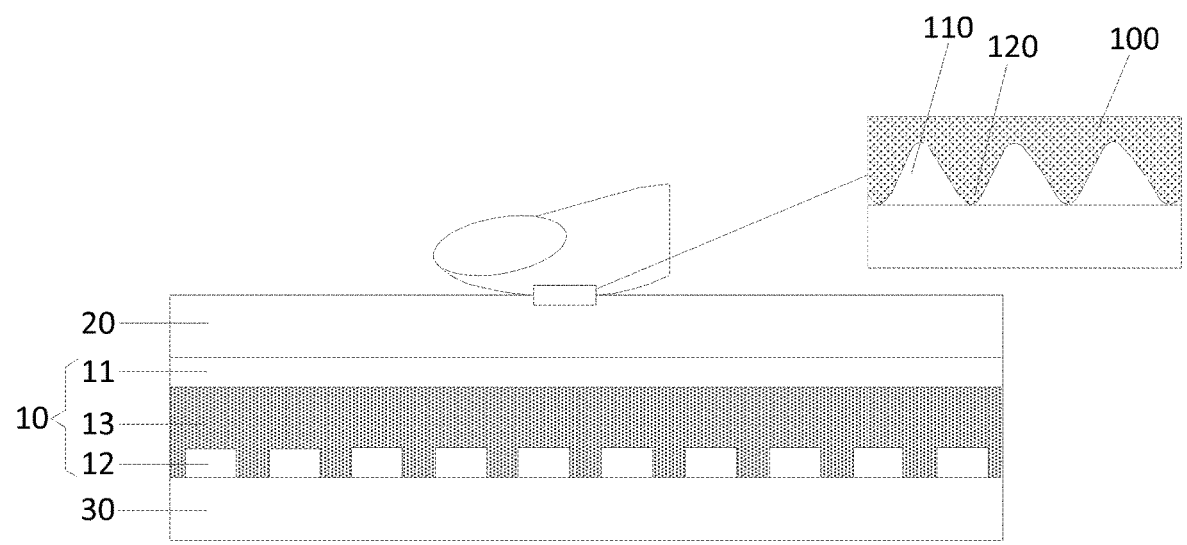
FIG. 3 is a schematic diagram of performing fingerprint recognition by an ultrasonic recognition module.
Figure 4:
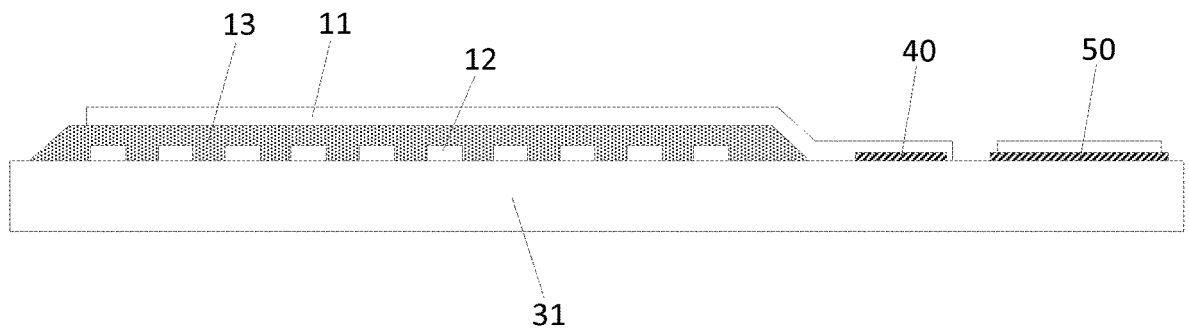
FIG. 4 is a schematic structural diagram of an ultrasonic recognition module.

FIG. 1 is a schematic diagram of transmitting ultrasonic waves by an ultrasonic recognition module. FIG. 2 is a schematic diagram of receiving ultrasonic waves by an ultrasonic recognition module. FIG. 3 is a schematic diagram of performing fingerprint recognition by an ultrasonic recognition module. FIG. 4 is a schematic structural diagram of an ultrasonic recognition module.

As shown in FIG. 1, the ultrasonic recognition module includes an ultrasonic sensor 10. The ultrasonic sensor 10 includes an upper electrode 11, a lower electrode 12, and a piezoelectric layer 13 located between the upper electrode 11 and the lower electrode 12. The piezoelectric layer 13 is made of piezoelectric materials, and can be excited by a voltage to generate a reverse piezoelectric effect. When an alternating voltage (an AC voltage) is inputted to the upper electrode 11 and the lower electrode 12 (for example, the upper electrode 11 is grounded, and an AC square wave is applied to the lower electrode 12), due to the inverse piezoelectric effect, the piezoelectric layer 13 may be deformed or drive film layers above and below the piezoelectric layer 13 to vibrate together, so that ultrasonic waves can be generated and transmitted outward. It should be noted that when a cavity (such as an air cavity) is formed in the side, away from the piezoelectric layer 13, of the upper electrode 11 or the side, away from the piezoelectric layer 13, of the lower electrode 12, the ultrasonic waves transmitted by the ultrasonic sensor can be strengthened, so that the ultrasonic waves can be better transmitted.

As shown in FIG. 2, the ultrasonic waves transmitted by the ultrasonic sensor 10 are reflected by a fingerprint 100, and the reflected ultrasonic waves are converted into an alternating voltage in the piezoelectric layer 13. In this case, the upper electrode 11 is grounded, and the lower electrode 12 can be used as a receiving electrode to receive the alternating voltage generated by the piezoelectric layer 13. The fingerprint 100 includes valleys 110 and ridges 120, and they have different reflection capabilities for the ultrasonic waves (the valleys 110 have a stronger reflection capability for the ultrasonic waves). Therefore, the intensity of the ultrasonic waves reflected by the valleys 110 is different from the intensity of the ultrasonic waves reflected by the ridges 120. Therefore, whether the ultrasonic waves are reflected by the valleys or by the ridges can be judged by using the alternating voltage received by the receiving electrode.

As shown in FIG. 3, the ultrasonic recognition module includes an upper electrode 11, multiple lower electrodes 12, a piezoelectric layer 13 located between the upper electrode 1 and the multiple lower electrodes 12, a substrate 20 located on the side, away from the piezoelectric layer 13, of the upper electrode 11, and a protective layer 30 located on the side, away from the piezoelectric layer 13, of the multiple lower electrodes 12. The ultrasonic sensor 10 made of the lower electrode 12, the piezoelectric layer 13 and the multiple upper electrodes 11 can transmit the ultrasonic waves and can also receive the ultrasonic waves, that is, the ultrasonic sensor 10 functions as both an ultrasonic transmitting sensor and an ultrasonic receiving sensor. When the fingerprint is in contact with the substrate 20, the ultrasonic waves transmitted by the ultrasonic sensor 10 are reflected by the fingerprint 100, and the reflected ultrasonic waves are converted into an alternating voltage in the piezoelectric layer 13. In this case, the upper electrode 11 is grounded, and the multiple lower electrodes 12 can be used as receiving electrodes, so that the alternating voltage generated by the piezoelectric layer 13 can be received at different positions. The fingerprint 100 includes valleys 110 and ridges 120, and they have different reflection capabilities for the ultrasonic waves (the valleys 110 have a stronger reflection capability for the ultrasonic waves). Therefore, the intensity of the ultrasonic waves reflected by the valleys 110 is different from the intensity of the ultrasonic waves reflected by the ridges 120. Therefore, the position information of the valleys and the ridges in the fingerprint 100 can be obtained by using the alternating voltages received by the multiple lower electrodes 12, so that fingerprint recognition can be implemented.

As shown in FIG. 4, the upper electrode 11, the lower electrodes 12 and the piezoelectric layer 13 may all be manufactured on the same side of a thin film transistor substrate 31. The ultrasonic recognition module further includes: a bias resistor 40 and a binding pad 50. The bias resistor 40 can be used for calibrating a voltage, and the binding pad 50 can be used for binding an external circuit.

In the research, the inventor of the present disclosure finds that in the process of transmitting ultrasonic waves by the ultrasonic recognition module, when the entire ultrasonic recognition module simultaneously performs transmitting, performance of fingerprint recognition is poor.

Figure 5:
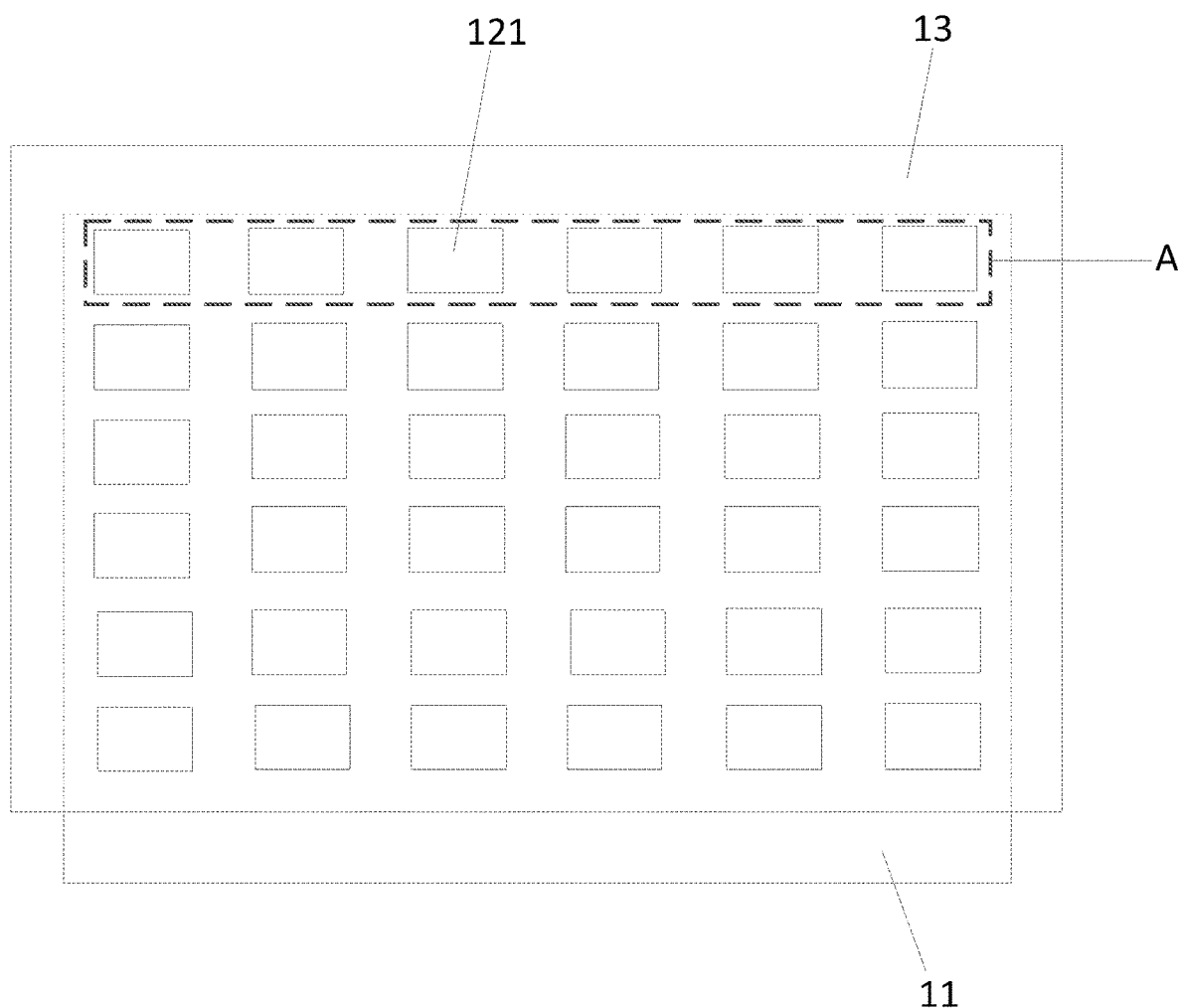
FIG. 5 is a first schematic structural top view of an ultrasonic recognition module according to an embodiment of the present disclosure.
Figure 6:
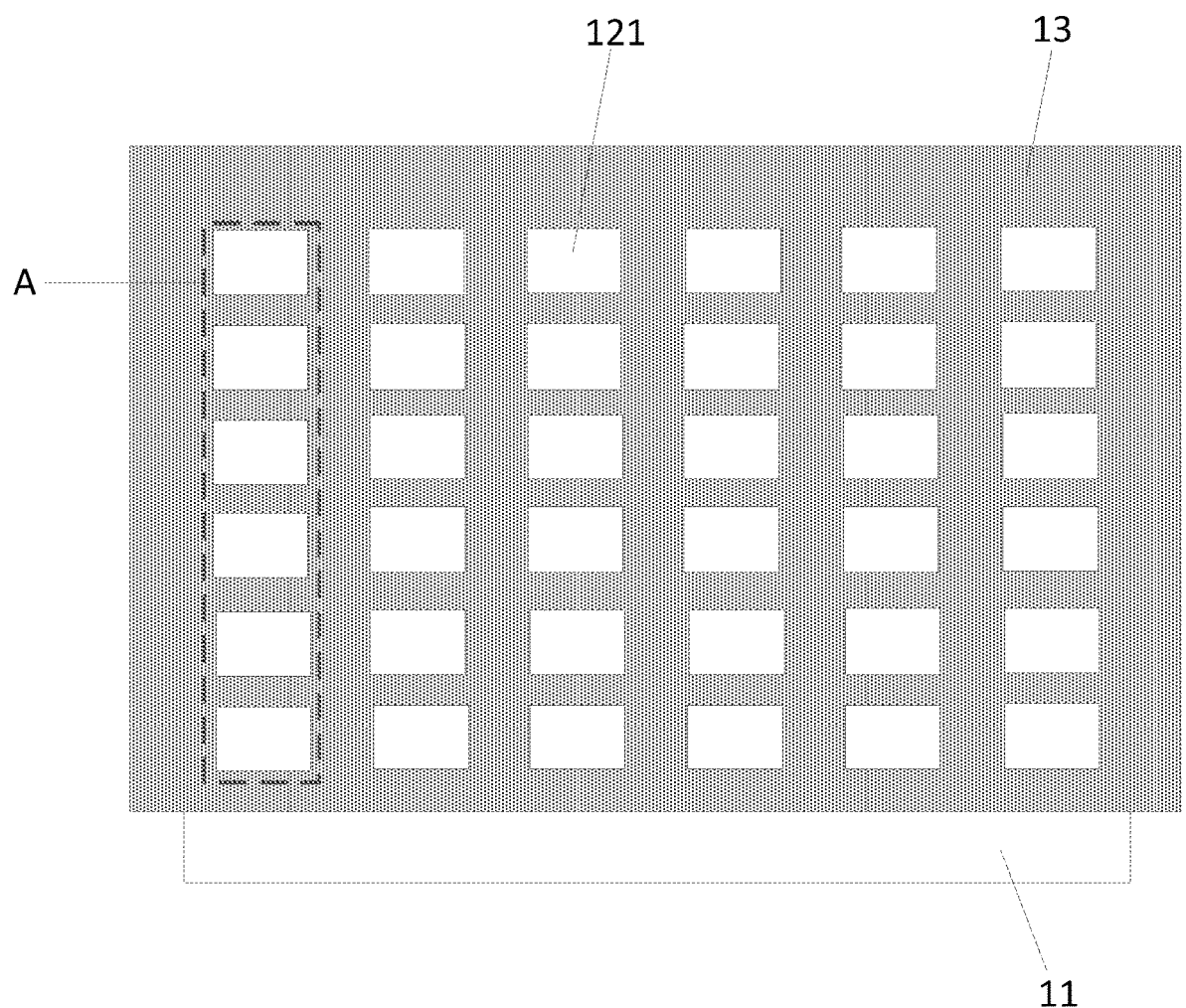
FIG. 6 is a second schematic structural top view of an ultrasonic recognition module according to an embodiment of the present disclosure.
Figure 7:
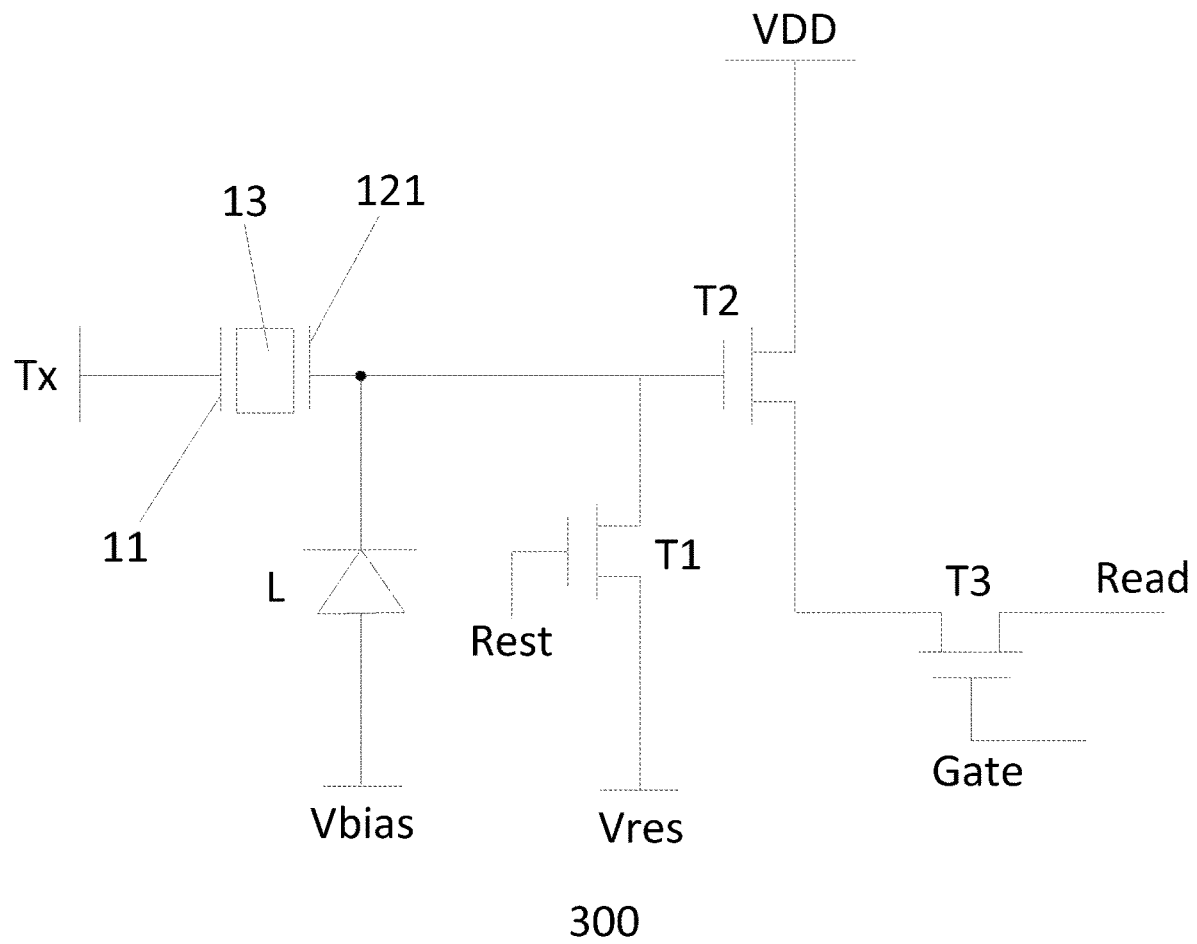
FIG. 7 is a first schematic structural diagram of a driving circuit according to an embodiment of the present disclosure.
Figure 8:
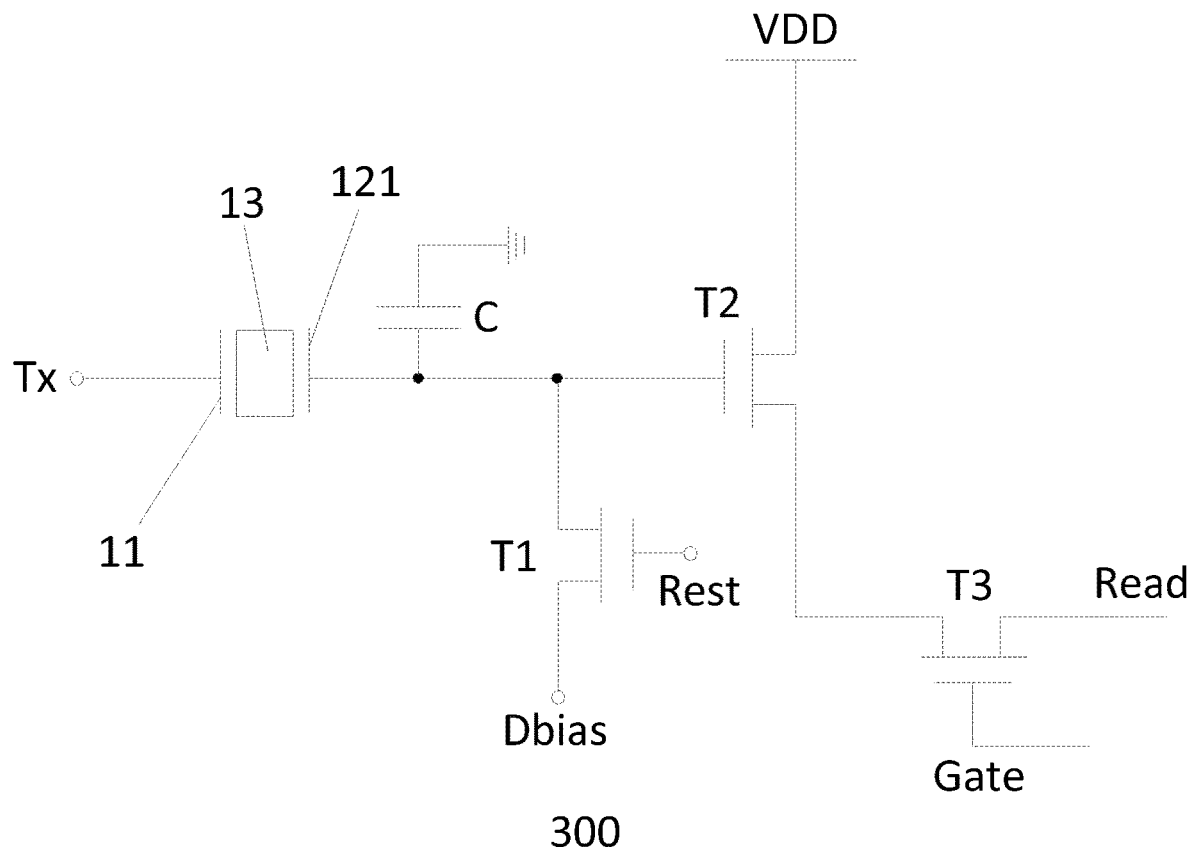
FIG. 8 is a second schematic structural diagram of a driving circuit according to an embodiment of the present disclosure.

In view of this, an embodiment of the present disclosure provides an ultrasonic recognition module. As shown in FIG. 5 and FIG. 6, FIG. 5 and FIG. 6 are respectively schematic structural top views of the ultrasonic recognition module according to an embodiment of the present disclosure. The ultrasonic recognition module includes multiple receiving electrodes 121 arranged in an array, and multiple driving circuits (not shown in FIG. 5 and FIG. 6) electrically connected to the receiving electrodes 121 in one-to-one correspondence. The multiple receiving electrodes 121 are divided into multiple receiving groups A. As shown in FIG. 5, each row of receiving electrodes 121 is a receiving group A. As shown in FIG. 6, each column of receiving electrodes 121 is a receiving group A. As shown in FIG. 7 and FIG. 8, FIG. 7 and FIG. 8 are respectively schematic diagrams of two types of circuit structures of the driving circuits. The driving circuits 300 include pulse signal input ends (Vres and Vbias in FIG. 7, and Dbias in FIG. 8). Vres and Vbias input a same pulse signal. The pulse signal input ends, such as Vres and Vbias, of the driving circuits 300 corresponding to the receiving electrodes 121 in the same receiving group A are electrically connected to a same pulse signal input line (not shown in FIG. 5 and FIG. 6), and the pulse signal input ends, such as Vres and Vbia, of the driving circuits 300 corresponding to the receiving electrodes 121 in the different receiving groups A are electrically connected to different pulse signal input lines.

In the ultrasonic recognition module provided by the embodiment of the present disclosure, the receiving electrodes are divided into the multiple receiving groups. The pulse signal input ends of the driving circuits corresponding to the receiving electrodes in the same receiving group are electrically connected to the same pulse signal input line, and the pulse signal input ends of the driving circuits corresponding to the receiving electrodes in the different receiving groups are electrically connected to the different pulse signal input lines. Focusing of the ultrasonic waves can be implemented by using the ultrasonic recognition module. On the one hand, the intensity or energy of the transmitted ultrasonic waves in a detection point area can be improved, so that performance of fingerprint recognition is improved. On the other hand, the transmitted ultrasonic waves can have better directivity, so that crosstalk between valleys and ridges of a fingerprint can be reduced, and the performance of fingerprint recognition can be further improved.

Optionally, in specific implementation, in the ultrasonic recognition module provided by the embodiment of the present disclosure, as shown in FIG. 5, the receiving electrodes 121 in the same row are located in the same receiving group A, and the receiving electrodes 121 in the different rows are located in the different receiving groups A.

Optionally, in specific implementation, in the ultrasonic recognition module provided by the embodiment of the present disclosure, as shown in FIG. 6, the receiving electrodes 121 in the same column are located in the same receiving group A, and the receiving electrodes 121 in the different columns are located in the different receiving groups A.

It should be noted that FIG. 5 and FIG. 6 are merely two possible embodiments for grouping the receiving electrodes enumerated in the present disclosure. Certainly, in specific implementation, there may be other types of grouping embodiments that are not enumerated herein.

Optionally, in specific implementation, in the ultrasonic recognition module provided by the embodiment of the present disclosure, as shown in FIG. 7, the driving circuit 300 includes a diode L, a first switch transistor T1, a second switch transistor T2, and a third switch transistor T3.

A first end of the diode L is electrically connected to a receiving electrode 121, and a second end of the diode L is electrically connected to a pulse signal input end Vbias.

A gate of the first switch transistor T1 is electrically connected to a reset signal end Rest, a first pole of the first switch transistor T1 is electrically connected to the receiving electrode 121, and a second pole of the first switch transistor T1 is electrically connected to a pulse signal input end Vres.

A gate of the second switch transistor T2 is electrically connected to the receiving electrode 121, a first pole of the second switch transistor T2 is electrically connected to a power supply end VDD, and a second pole of the second switch transistor T2 is electrically connected to a first pole of the third switch transistor T3. A gate of the third switch transistor T3 is electrically connected to a scanning signal end Gate, and a second pole of the third switch transistor T3 is electrically connected to a signal reading end Read.

Optionally, in specific implementation, in the ultrasonic recognition module provided by the embodiment of the present disclosure, as shown in FIG. 8, the driving circuit 300 includes a storage capacitor C, a first switch transistor T1, a second switch transistor T2, and a third switch transistor T3.

A first end of the storage capacitor C is electrically connected to a receiving electrode 121, and a second end of the storage capacitor C is grounded.

A gate of the first switch transistor T1 is electrically connected to a reset signal end Rest, a first pole of the first switch transistor T1 is electrically connected to the receiving electrode 121, and a second pole of the first switch transistor T1 is electrically connected to a pulse signal input end Dbias.

A gate of the second switch transistor T2 is electrically connected to the receiving electrode 121, a first pole of the second switch transistor T2 is electrically connected to a power supply end VDD, and a second pole of the second switch transistor T2 is electrically connected to a first pole of the third switch transistor T3. A gate of the third switch transistor T3 is electrically connected to a scanning signal end Gate, and a second pole of the third switch transistor T3 is electrically connected to a signal reading end Read.

Optionally, in specific implementation, in the ultrasonic recognition module provided by the embodiment of the present disclosure, as shown in FIG. 5 and FIG. 6, the ultrasonic recognition module further includes: a driving electrode 11 disposed opposite to a film layer where the receiving electrodes 121 are located, a piezoelectric layer 13 between the driving electrode 11 and the film layer where the receiving electrodes 121 are located. The driving electrode 11 and the piezoelectric layer 13 are formed over an entire surface.

Optionally, to make the ultrasonic recognition module have higher receiving sensitivity to the ultrasonic waves, the piezoelectric layer 13 is generally made of a piezoelectric material, such as PVDF (polyvinylidene fluoride), with a high piezoelectric constant.

Figure 9:
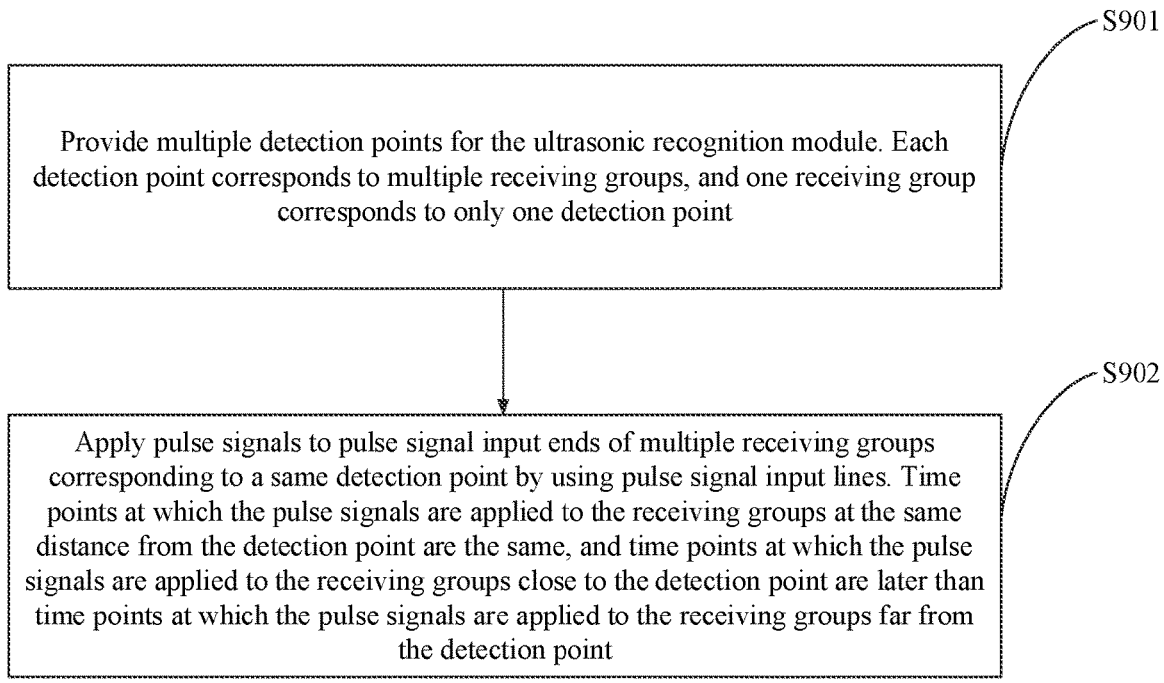
FIG. 9 is a schematic flowchart of a driving method of an ultrasonic recognition module according to an embodiment of the present disclosure.
Figure 10:
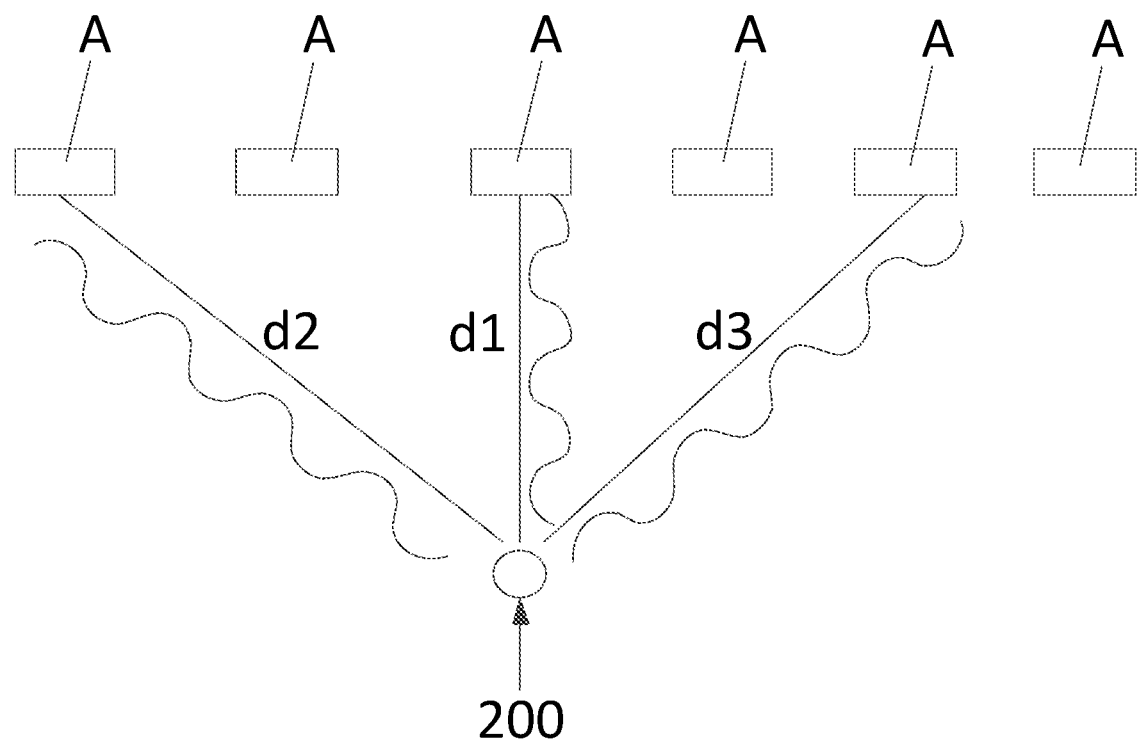
FIG. 10 is a first principle diagram of a driving method of an ultrasonic recognition module according to an embodiment of the present disclosure.
Figure 11:
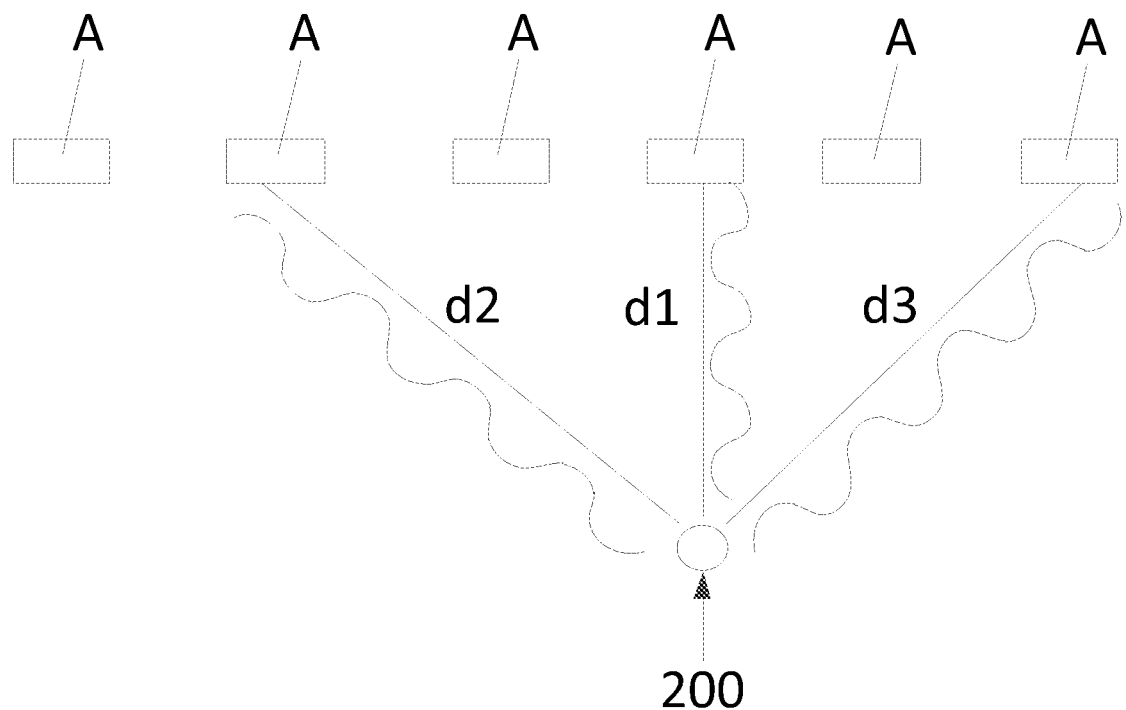
FIG. 11 is a second principle diagram of a driving method of an ultrasonic recognition module according to an embodiment of the present disclosure.

Based on the same inventive concept, an embodiment of the present disclosure provides a driving method of an ultrasonic recognition module. As shown in FIG. 9, the method includes the following steps:

S901, providing multiple detection points by the ultrasonic recognition module. Each detection point corresponds to multiple receiving groups, and one receiving group corresponds to only one detection point. Specifically, as shown in FIG. 10 and FIG. 11, FIG. 10 and FIG. 11 are respectively schematic principle diagrams of ultrasonic detection corresponding to each detection point. The ultrasonic recognition module is provided with multiple detection points 200. Each detection point 200 corresponds to the multiple receiving groups A, and one receiving group A corresponds to only one detection point 200; and S902, applying pulse signals to pulse signal input ends of the multiple receiving groups corresponding to the same detection point by using the pulse signal input lines. Time points for loading the pulse signals by the receiving groups that are at the same distance from the detection point are the same, and time points for loading the pulse signals by the receiving groups that are close to the detection point are later than time points for loading the pulse signals by the receiving groups that are far from the detection point.

In the driving method of the ultrasonic recognition module provided by the embodiment of the present disclosure, the multiple receiving electrodes are divided into the multiple receiving groups. The pulse signal input ends of the driving circuits corresponding to the receiving electrodes in the same receiving group are electrically connected to the same pulse signal input line, and the pulse signal input ends of the driving circuits corresponding to the receiving electrodes in the different receiving groups are electrically connected to the different pulse signal input lines. The pulse signals are applied to the pulse signal input ends of the multiple receiving groups corresponding to the same detection point by using the pulse signal input lines; the time points for loading the pulse signals by the receiving groups that are at the same distance from the detection point are the same, and the time points for loading the pulse signals by the receiving groups that are close to the detection point are later than time points for loading the pulse signals by the receiving groups that are far from the detection point. In the driving method of the ultrasonic recognition module provided by the embodiment of the present disclosure, the receiving electrodes are grouped, and the multiple receiving groups corresponding to each detection point determine the time point of inputting the pulse signals according to the distance from the detection point, so that focusing of ultrasonic waves can be implemented. On the one hand, the intensity or energy of the transmitted ultrasonic waves in a detection point area can be improved, so that performance of fingerprint recognition is improved. On the other hand, the transmitted ultrasonic waves can have better directivity, so that crosstalk between valleys and ridges of a fingerprint can be reduced, and the performance of fingerprint recognition can be further improved.

It should be noted that the detection points in the embodiment of the present disclosure refers to touch positions when a finger touches the ultrasonic recognition module.

Further, in specific implementation, in the driving method of the ultrasonic recognition module provided by the embodiment of the present disclosure, as shown in FIG. 5, the receiving electrodes 121 located in the same row are the receiving group A, or as shown in FIG. 6, the receiving electrodes 121 in the same column are the receiving group A.

Optionally, the driving electrode 11 provided in the embodiment of the present disclosure is arranged on an entire surface, and the multiple receiving electrodes 121 are independently disposed; therefore, only when corresponding voltages are applied to both the driving electrode 11 and the receiving electrodes 121, the piezoelectric layer 13 can be deformed to transmit ultrasonic waves. The six receiving groups A are used as an example in schematic principle diagrams of ultrasonic detection shown in FIG. 10 and FIG. 11. Each receiving group A corresponds to one row or column of receiving electrodes 121. One detection point 200 corresponds to the three receiving groups A. All the driving electrodes 11, the piezoelectric layer 13 corresponding to the driving electrodes 11, and the receiving groups A overlapped with the driving electrodes 11 constitute an ultrasonic transmitting element. All the receiving electrodes 121, the piezoelectric layer 13 corresponding to the receiving electrode 121, and the driving electrode 11 overlapped with the receiving electrodes 121 constitute an ultrasonic receiving element. When the ultrasonic recognition module performs fingerprint recognition, the receiving electrodes 121 can be grounded, and then an alternating voltage is applied to the driving electrode 11. Due to the inverse piezoelectric effect, the piezoelectric layer 13 corresponding to the driving electrode can be deformed or drive film layers on the upper part and the lower part of the piezoelectric layer 13 to vibrate together, so that ultrasonic waves can be generated and transmitted outward. The ultrasonic recognition module includes the multiple receiving electrodes 121 arranged in the array, the multiple receiving electrodes 121 are divided into the multiple receiving groups A, and the receiving electrodes 121 in each receiving group A are electrically connected to the same pulse signal input line. Therefore, each receiving group can constitute one ultrasonic transmitting element, that is, the multiple receiving groups can constitute multiple ultrasonic transmitting elements, so that focusing of the ultrasonic waves can be implemented by separately driving the multiple groups of receiving electrodes. On the one hand, the intensity or energy of the transmitted ultrasonic waves in the detection point area can be improved, so that the performance of fingerprint recognition is improved. On the other hand, the transmitted ultrasonic waves can have the better directivity, so that crosstalk between the valleys and the ridges of the fingerprint can be reduced, and performance of fingerprint recognition can be further improved. When the transmitted ultrasonic waves are reflected back to the ultrasonic recognition module by the fingerprint, the multiple ultrasonic receiving elements corresponding to the multiple receiving electrodes 121 can receive the reflected ultrasonic waves and convert the ultrasonic signals into electrical signals, so that fingerprint identification is implemented.

Figure 12:
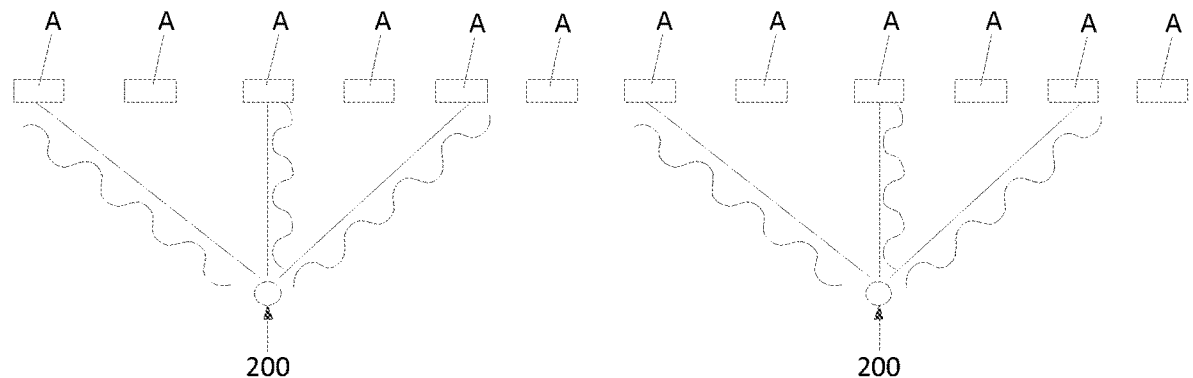
FIG. 12 is a third principle diagram of a driving method of an ultrasonic recognition module according to an embodiment of the present disclosure.

Optionally, in specific implementation, in the driving method of the ultrasonic recognition module provided by the embodiment of the present disclosure, as shown in FIG. 12, ultrasonic detection is simultaneously performed on the detection points 200 corresponding to the receiving groups A which do not spatially cross. Because the receiving groups A corresponding to the detection points 200 do not spatially cross, the detection points 200 do not affect each other when receiving the ultrasonic waves, and ultrasonic detection can be simultaneously performed, so that the recognition time of the entire ultrasonic recognition module is reduced.

Figure 13:
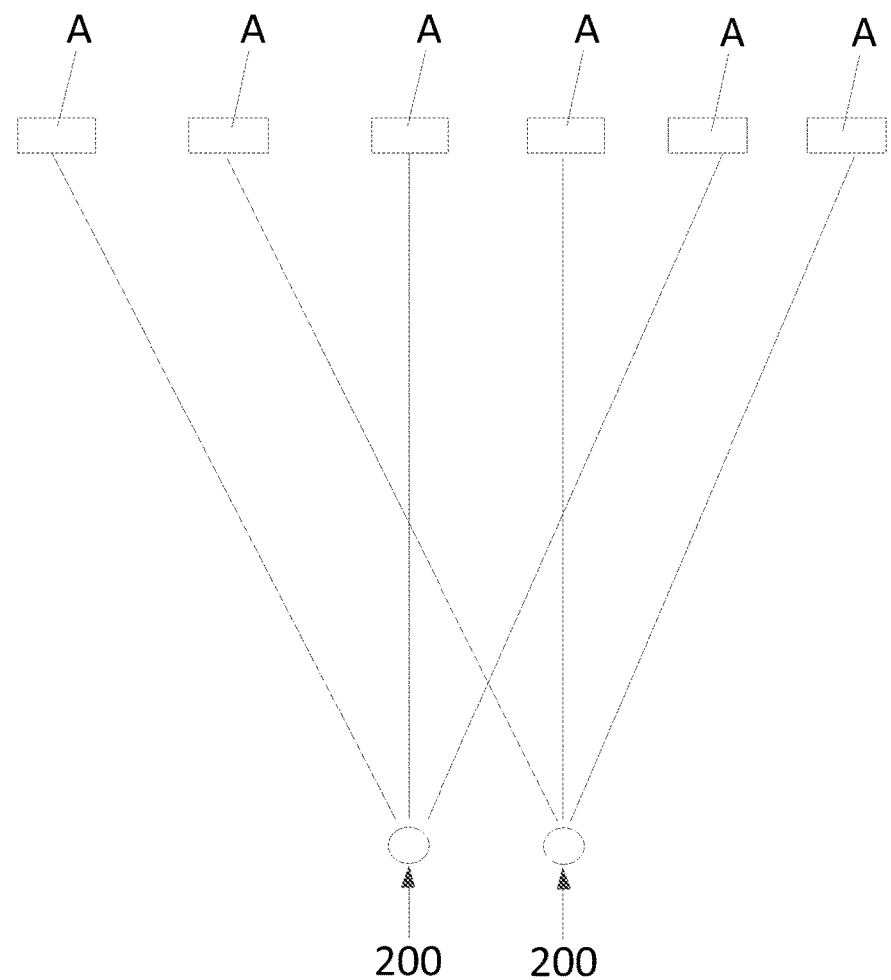
FIG. 13 is a fourth principle diagram of a driving method of an ultrasonic recognition module according to an embodiment of the present disclosure.

Optionally, in specific implementation, in the driving method of the ultrasonic recognition module provided in the embodiment of the present disclosure, as shown in FIG. 13, ultrasonic detection is sequentially performed on the detection points 200 corresponding to the receiving groups A which spatially cross. For example, ultrasonic detection is first performed on the detection point 200 on the left side of FIG. 11, and ultrasonic detection is then performed on the detection point 200 on the right side. Because the receiving groups A corresponding to the detection points 200 spatially cross, ultrasonic wave detection needs to be performed on these detection points 200 in a time division mode to avoid interference when the detection points receive the ultrasonic waves, so that accuracy of fingerprint detection is improved.

Optionally, in specific implementation, in the driving method of the ultrasonic recognition module provided in the embodiment of the present disclosure, as shown in FIG. 13, ultrasonic detection is sequentially performed on the detection points corresponding to the receiving groups A 200 spatially crossing. Specifics are as follows:

when ultrasonic detection is performed on one detection point 200 (such as on the left side), the receiving electrodes 121 of the multiple receiving groups A corresponding to the other detection point 200 (such as on the right side) are in a floating state. Specifically, the driving electrode in the ultrasonic recognition module provided by the embodiment of the present disclosure is an electrode provided on an entire surface, and there are multiple receiving electrodes arranged in the array. Therefore, when ultrasonic detection is performed on the detection point 200 on the left side, a voltage only needs to be applied to the driving electrode and the receiving electrodes of the three receiving groups A corresponding to the detection point 200 on the left side, and the time point of inputting a pulse signal to the receiving group A (the third receiving group A from the left) that is close to the detection point 200 is later than the time point of inputting a pulse signal to the receiving groups A (the first receiving group and fifth receiving group A from the left) that are far from the detection point 200. However, no voltage is applied to the receiving electrodes of the three receiving groups A corresponding to the detection point 200 on the right side, that is, the receiving electrodes of the three receiving groups A corresponding to the detection point 200 on the right side are in a floating (Floating) state. After ultrasonic detection on the detection point 200 on the left side is completed, and no voltage is applied to the receiving electrodes of the three receiving groups A corresponding to the detection point 200 on the left side, that is, the receiving electrodes of the three receiving groups A corresponding to the detection point 200 on the left side are in a floating (Floating) state, a voltage is applied to the receiving electrodes of the three receiving groups A corresponding to the detection point 200 on the right side, and the time point of inputting a pulse signal to the receiving group A (the fourth receiving group A from the left) that is close to the detection point 200 is later than the time point of inputting a pulse signal to the receiving groups (the second receiving group and the sixth receiving group A from the left) that are far from the detection point 200, to perform ultrasonic detection on the detection point 200 on the right side. In this way, ultrasonic detection is sequentially performed on the detection points 200 which spatially cross, so that interference does not occur.

Optionally, in specific implementation, in the driving method of the ultrasonic recognition module provided by the embodiment of the present disclosure, as shown in FIG. 13, every two adjacent receiving groups A correspond to the different detection points 200, and the receiving group A corresponding to the different detection points 200 are alternatively arranged. Optionally, the first receiving group A from the left corresponds to the first detection point 200 from the left, the second receiving group A from the left corresponds to the second detection point 200 from the left, the third receiving group A from the left corresponds to the first detection point 200 from the left, the fourth receiving group A from the left corresponds to the second detection point 200 from the left, the fifth receiving group A from the left corresponds to the first detection point 200 from the left, and the sixth receiving group from the left A corresponds to the second detection point 200 from the left, that is, every two adjacent receiving groups A correspond to the different detection points 200, and the receiving groups A corresponding to the different detection points 200 are alternately arranged. Certainly, in specific implementation, every adjacent three receiving groups A can correspond to the same detection point 200, and the receiving groups A corresponding to the detection points 200 do not spatially cross, t the receiving electrodes arranged in an array are only grouped, all the groups are electrically connected to the different pulse signal input lines correspondingly, and the time point of inputting the pulse signal to the receiving group that is close to the detection point is later than the time point of inputting a pulse signal to the receiving group that is far from the detection point. These all belong to the scope of the present disclosure, and are not enumerated herein.

Optionally, in specific implementation, in the driving method of the ultrasonic recognition module provided by the embodiment of the present disclosure, as shown in FIG. 10 to FIG. 15, each detection point 200 corresponds to an odd number of receiving groups A, and the receiving group A in the center location of the odd number of receiving groups A is a first receiving group, the receiving groups A on both sides of the first receiving group are second receiving groups, the second receiving groups are symmetrically arranged along the first receiving group, and the detection point 200 is located directly above the first receiving group. A voltage is applied to the driving electrode, a pulse signal is applied to the second receiving groups at a first time point, and a pulse signal is applied to the first receiving group in a second time point. The second time point is later than the first time point because the first receiving group is relatively close to the detection point 200. Therefore, the design of the present disclosure can implement focusing of the ultrasonic waves, that is, the intensity or energy of the ultrasonic waves directly above the first receiving group is enhanced, so that accuracy of fingerprint recognition is improved.

Figure 16:
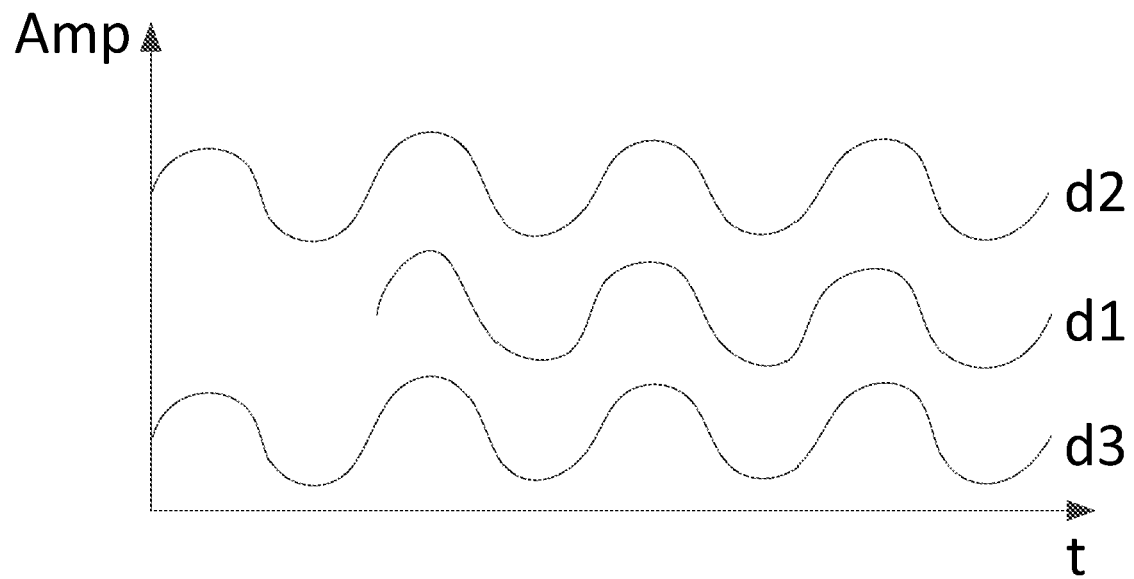
FIG. 16 is a diagram of durations of ultrasonic waves of the driving method of the ultrasonic recognition module shown in FIG. 10 and FIG. 11.

Optionally, as shown in FIG. 10 and FIG. 11, the time point of inputting the pulse signal to the receiving group A that is close to the detection point 200 is later than the time point of inputting the pulse signal to the receiving group A that is far from the detection point 200. Therefore, a timing diagram of ultrasonic transmission of the receiving groups A corresponding to the detection points 200 in FIG. 10 and FIG. 11 is shown in FIG. 16. Optionally, the ultrasonic transmission timing corresponding to the first receiving group A (the distance from the detection point is d2) and the fifth receiving group A (the distance from the detection point is d3) from the left in FIG. 10 is ultrasonic waves d2 and d3 as shown in FIG. 12, and the ultrasonic transmission timing corresponding to the third receiving group A from the left (the distance from the detection point is d1) in FIG. 10 is the ultrasonic wave d1 as shown in in FIG. 12. It can be learned that d1 is transmitted later than d2 and d3, and d2 and d3 are simultaneously transmitted, so that the ultrasonic waves are focused directly above the third receiving group A. The ultrasonic transmission timing corresponding to the second receiving group A (the distance from the detection point is d2) and the sixth receiving group A (the distance from the detection point is d3) from the left in FIG. 11 is ultrasonic waves d2 and d3 as shown in FIG. 12, and the ultrasonic transmission timing corresponding to the fourth receiving group A from the left (the distance from the detection point is d1) in FIG. 11 is the ultrasonic wave d1 as shown in in FIG. 12. It can be learned that d1 is transmitted later than d2 and d3, and d2 and d3 are simultaneously transmitted, but the time of transmitting the ultrasonic signal of d1 is shorter than the time of transmitting the ultrasonic signals of d2 and d3, so that the ultrasonic waves are focused directly above the fourth receiving group A.

Figure 14:
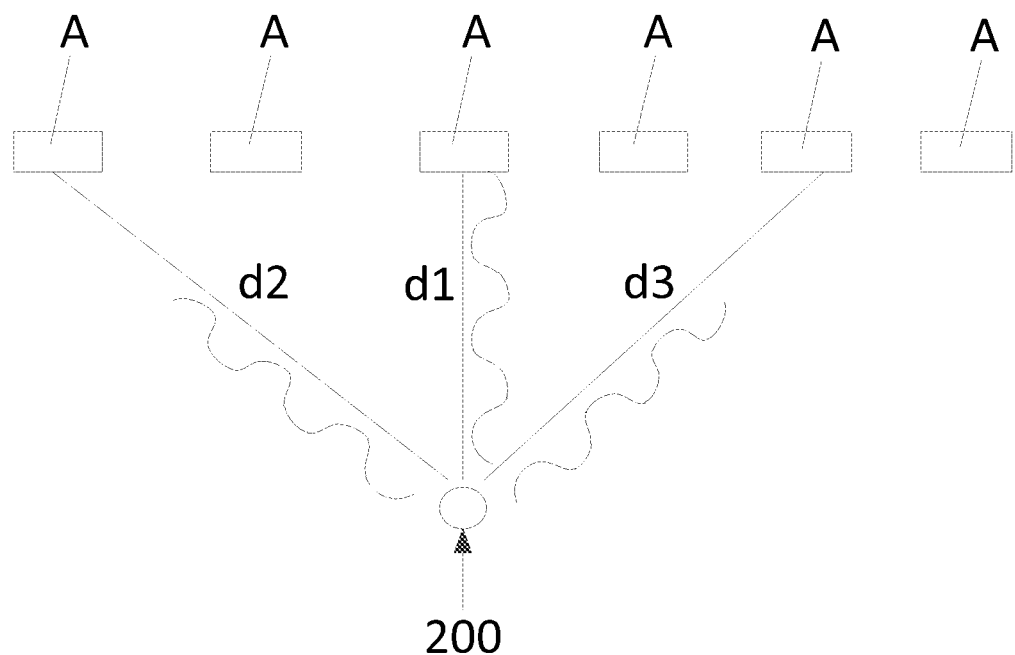
FIG. 14 is a fifth principle diagram of a driving method of an ultrasonic recognition module according to an embodiment of the present disclosure.
Figure 15:
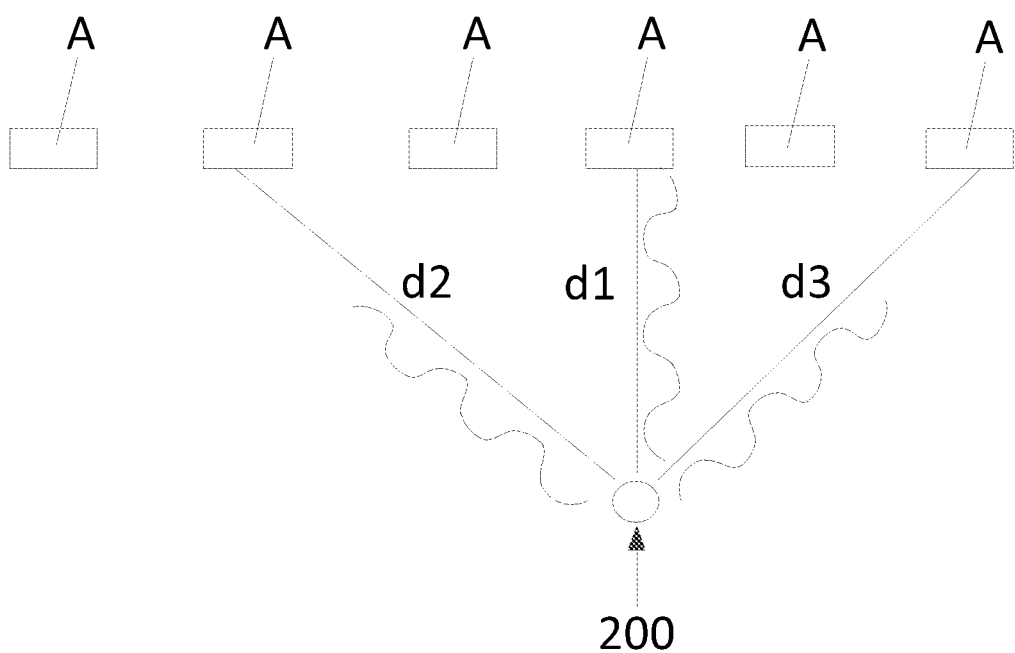
FIG. 15 is a sixth principle diagram of a driving method of an ultrasonic recognition module according to an embodiment of the present disclosure.
Figure 17:
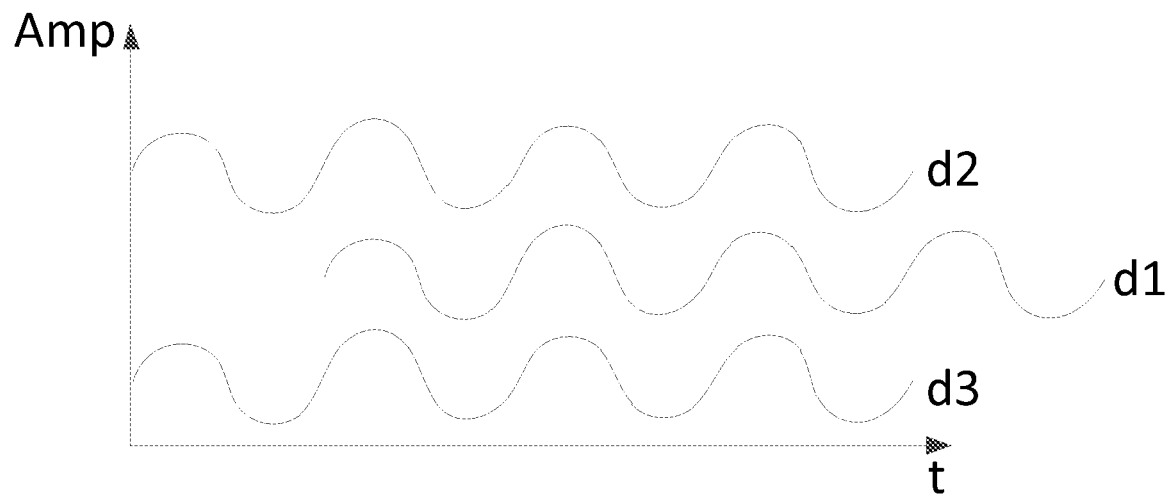
FIG. 17 is a diagram of durations of ultrasonic waves of the driving method of the ultrasonic recognition module shown in FIG. 14 and FIG. 15.

As shown in FIG. 14 and FIG. 15, another embodiment of ultrasonic transmission is provided. A timing diagram of ultrasonic transmission of the receiving groups A corresponding to the detection points 200 in FIG. 14 and FIG. 15 is shown in FIG. 17. The time point of transmitting the ultrasonic wave by the receiving group A that is close to the detection point is later than the time point of transmitting the ultrasonic wave by the receiving group A that is far from the detection point, but durations of the ultrasonic signals transmitted by the three receiving groups are the same.

Optionally, in diagrams of ultrasonic transmission duration corresponding to FIG. 16 and FIG. 17, focusing of the ultrasonic waves can be implemented.

Figure 18:
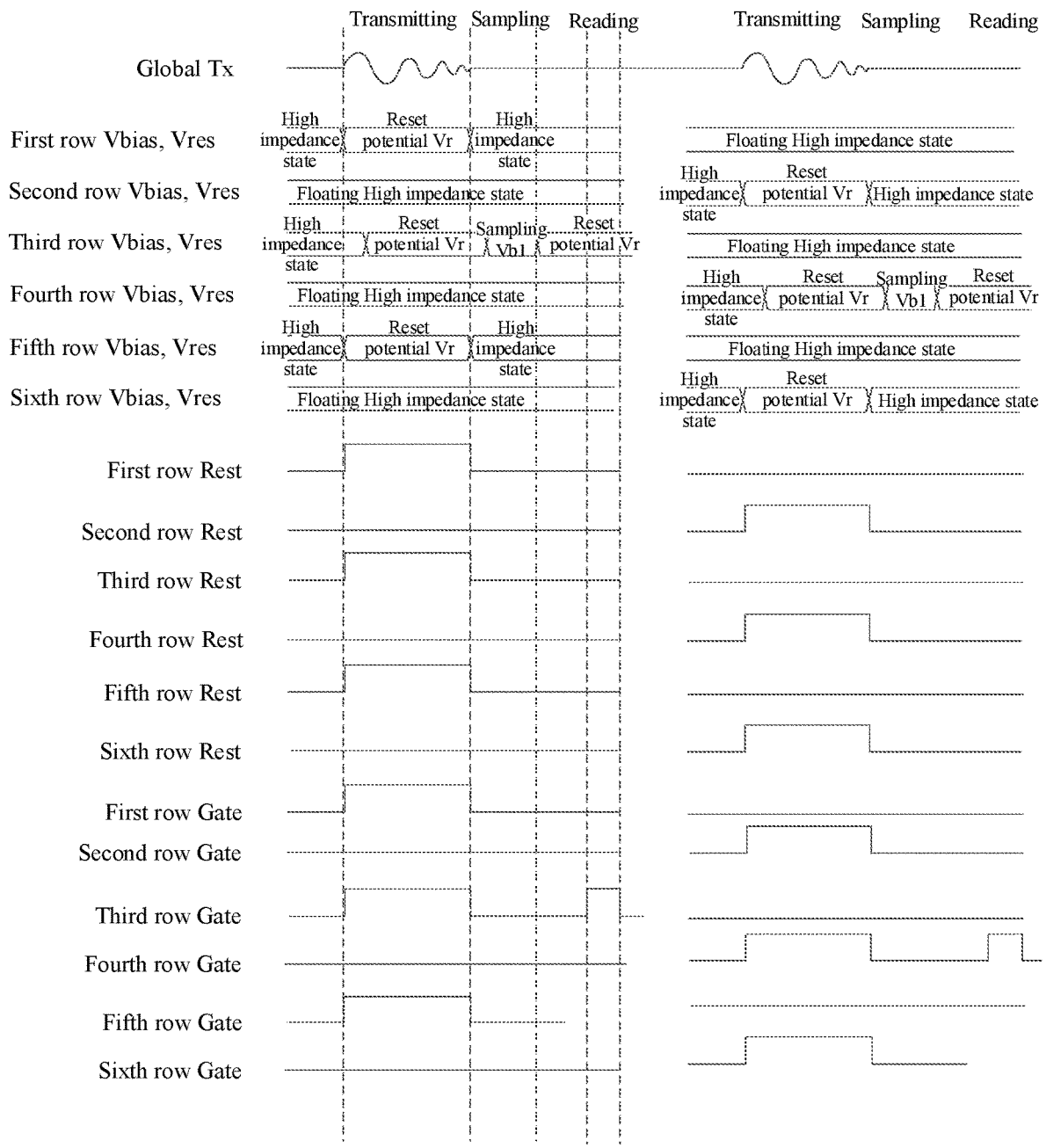
FIG. 18 is a timing diagram of a driving method of an ultrasonic recognition module according to an embodiment of the present disclosure.

FIG. 18 is a timing diagram of a driving method of an ultrasonic recognition module according to an embodiment of the present disclosure. Specifically, FIG. 18 is a timing diagram of the driving circuit shown in FIG. 7. The detection point 200 and the receiving groups A shown in FIG. 10 are used as an example to explain the principle of focusing of the ultrasonic waves. As shown in FIG. 18, three stages: transmitting, sampling and reading are included. Specifically, FIG. 10 is only based on an example in which the six rows of receiving electrodes A correspond to the two detection points 200. Certainly, in specific implementation, more rows of receiving electrodes and more detection points may be included.

The transmitting stage: A driving voltage is applied to the driving electrode 11 (shown as Tx in FIG. 18), signals of the reset signal ends Rest corresponding to a first row, a third row, and a fifth row are high potential signals, and all second switch transistors T2 corresponding to the first row, the third row, and the fifth row are turned on. The receiving groups A corresponding to the first row, the third row, and the fifth row of receiving electrodes 121 correspond to the same detection point 200, and the distance from the receiving groups A corresponding to the first row and the fifth row to the detection point 200 is greater than the distance from the receiving group A corresponding to the third row to the detection point 200. Therefore, pulse signals are inputted to the first row and the fifth row of receiving electrodes in the receiving groups A by using the pulse signal input end Vres, so that the voltage is applied to the first row and the fifth row of receiving electrodes in the receiving groups A, to drive the piezoelectric layer 13 corresponding to the first row and the fifth row of receiving electrodes to transmit the ultrasonic waves. However, a time point at which a voltage is applied to the receiving electrodes of the third row of receiving group A input the voltage later than the voltage input by the first row and the fifth row of receiving electrodes by using the pulse signal input end Vres, so that the ultrasonic waves are focused at the detection point 200 located directly above the third-row receiving group A. In a process of performing ultrasonic detection on the detection points 200 corresponding to the first row, the third row, and the fifth row of receiving electrodes 121, signals of reset signal ends Rest corresponding to a second row, a fourth row, and a sixth row are low-potential signals, and all second switch transistors T2 corresponding to the second row, the fourth row, and the sixth row are cut off, and no voltage is applied to the receiving electrodes 121 corresponding to the second row, the fourth row, and the sixth row, so that the second row, the fourth row, and the sixth row of receiving electrodes 121 are in a floating state (Floating high impedance state) in the three stages. Although the voltage is applied to the driving electrodes corresponding to the second row, the fourth row, and the sixth row, the receiving electrodes corresponding to the second row, the fourth row, and the sixth row are in a floating state. Therefore, the piezoelectric layer cannot be driven, and ultrasonic waves cannot be transmitted in the second row, the fourth row, and the sixth row.

The sampling stage: Signals of reset signal ends Rest corresponding to the first row, the third row, and the fifth row are low-potential signals, and all second switch transistors T2 corresponding to the first row, the third row, and the fifth row are cut off. A pulse signal Vb1 is inputted by a pulse signal input end Vbias, the pulse signal Vb1 is higher than the pulse signal Vr inputted by Vres during the transmitting stage, and a diode L performs sampling.

The reading stage: Because the detection point 200 is located above the third-row receiving group A, the ultrasonic signal of the third row is read. For example, a reading instruction signal is applied to a scanning signal end Gate of the third row, and all third switch transistors T3 are turned on, to read the ultrasonic signal.

Therefore, ultrasonic detection of the detection points corresponding to the first row, the third row, and the fifth row of receiving electrodes is implemented by using the above three stages. After ultrasonic detection of the detection points corresponding to the first row, the third row, and the fifth row of receiving electrodes is completed, ultrasonic detection of the detection points corresponding to the second row, the fourth row, and the sixth row of receiving electrodes is performed. As shown in the timing diagram on the right side in FIG. 18, a specific detection principle is the same as the principle of ultrasonic detection of the detection points corresponds to the first row, the third row, and the fifth row of receiving electrodes. Details are not described in herein.

It should be noted that the timing diagram shown in FIG. 18 is only an example provided by the embodiment of the present disclosure, and the driving circuit provided by the embodiment of the present disclosure may also be driven by other timing according to actual conditions.

In specific implementation, focusing of the ultrasonic waves can also be implemented by using the driving circuit shown in FIG. 8. In the embodiment of the present disclosure, focusing of the ultrasonic waves can further be performed according to the driving circuit shown in FIG. 8. Specifically, floating or modulation is performed on one end of the receiving electrode 121. Specifically, floating is performed on Dbias, and thus an rst switch is turned on. Alternatively, the rst switch is turned on, and thus a waveform the same as Tx is inputted by using Dbias.

Based on the same inventive concept, an embodiment of the present disclosure further provides a display device, including any one of the foregoing ultrasonic recognition modules provided by the embodiments of the present disclosure. The principle of the display device for solving the problem is similar to that of the ultrasonic recognition module. Therefore, implementation of the display device can refer to implementation of the ultrasonic recognition module. Details are not repeated herein.

Figure 19:
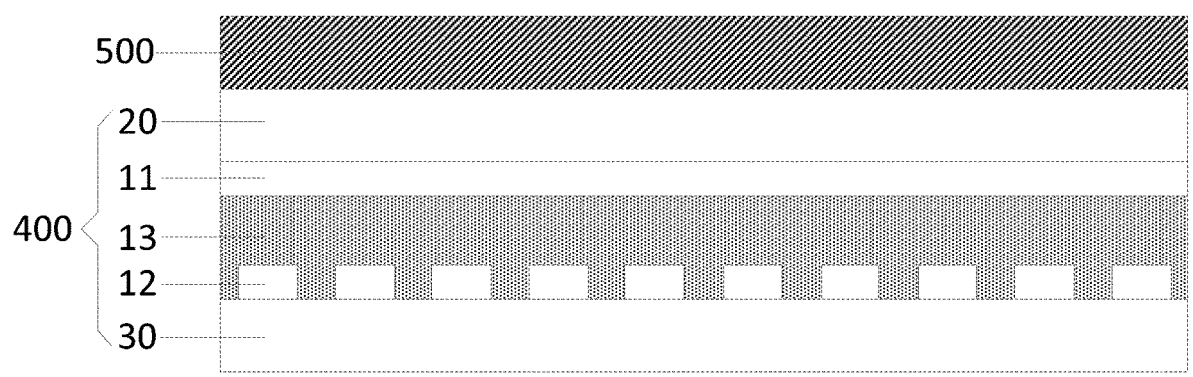
FIG. 19 is a schematic structural diagram of a display device according to an embodiment of the present disclosure.

In specific implementation, as shown in FIG. 19, the display device further includes a display module 500, and an area of the display module 500 is substantially the same as that of the ultrasonic recognition module 400, so that full-screen fingerprint recognition can be implemented. In this case, the ultrasonic recognition module can further implement a touch control function, so that there may no need to provide additional touch devices such as a capacitive touch panel, and costs of the display device can be reduced. Certainly, the embodiments of the present disclosure include, but are not limited to the above contents. The area of the display module and the area of the ultrasonic recognition module may not be equal, and the ultrasonic recognition module may be disposed only in a region in which fingerprint identification is required.

In specific implementation, the display device provided by the embodiment of the present disclosure may be any product or component, such as a mobile phone, a tablet computer, a television, a display, a notebook computer, a digital photo frame, and a navigator, having a display function. It should be understood by the person of ordinary skill in the art that the display device has other essential components. Details are not described herein. This should not be used as a limitation on the present disclosure. For the implementation of the display device, reference may be made to the embodiments of the display panel. Details are not repeated herein.

The embodiments of the present disclosure provide the ultrasonic recognition module, the driving method thereof, and the display device. The multiple receiving electrodes are divided into the multiple receiving groups. The pulse signal input ends of the driving circuits corresponding to the receiving electrodes in the same receiving group are electrically connected to the same pulse signal input line, and the pulse signal input ends of the driving circuits corresponding to the receiving electrodes in the different receiving groups are electrically connected to the different pulse signal input lines. The pulse signals are applied to the pulse signal input ends of the multiple receiving groups corresponding to the same detection point by using the pulse signal input lines; the time points for loading the pulse signals by the receiving groups that are at the same distance from the detection point are the same, and the time points for loading the pulse signals by the receiving groups that are close to the detection point are later than time points for loading the pulse signals by the receiving groups that are far from the detection point. In the driving method of the ultrasonic recognition module provided by the embodiment of the present disclosure, the receiving electrodes are grouped, and the multiple receiving groups corresponding to each detection point determine the time point of inputting the pulse signal according to the distance from the detection point, so that focusing of the ultrasonic waves can be implemented. On the one hand, the intensity or energy of the transmitted ultrasonic waves in a detection point area can be improved, so that performance of fingerprint recognition is improved. On the other hand, the transmitted ultrasonic waves can have better directivity, so that crosstalk between valleys and ridges of a fingerprint can be reduced, and the performance of fingerprint recognition can be further improved.

Obviously, a person skilled in the art can make various modifications and variations to the present disclosure without departing from the spirit and scope of the present disclosure. In this way, if these modifications and variations of the present disclosure fall within the scope of the claims of the present disclosure and their equivalent technologies, the present disclosure also intends to include these modifications and variations.

The invention claimed is:

1. An ultrasonic recognition module, comprising: a plurality of receiving electrodes arranged in an array, and a plurality of driving circuits electrically connected to the plurality of receiving electrodes in a one-to-one correspondence mode, wherein the plurality of receiving electrodes are divided into a plurality of receiving groups, the plurality of driving circuits respectively comprise a pulse signal input end, pulse signal input ends of driving circuits corresponding to the receiving electrodes in a same receiving group are electrically connected to a same pulse signal input line, the pulse signal input ends of driving circuits corresponding to the receiving electrodes in different receiving groups are electrically connected to different pulse signal input lines;

wherein the ultrasonic recognition module further comprises: a driving electrode disposed opposite to a film layer where the plurality of receiving electrodes are located, and a piezoelectric layer located between the driving electrode and the film layer where the plurality of receiving electrode is located, wherein the driving electrode and the piezoelectric layer are formed over an entire surface.

2. The ultrasonic recognition module according to claim 1, wherein the receiving electrodes in a same row are located in a same receiving group, and the receiving electrodes in different rows are located in different receiving groups.

3. The ultrasonic recognition module according to claim 1, wherein the receiving electrodes in a same column are located in a same receiving group, and the receiving electrodes in different columns are located in different receiving groups.

4. The ultrasonic recognition module according to claim 1, wherein the plurality of driving circuits respectively comprise a diode, a first switch transistor, a second switch transistor, and a third switch transistor; wherein, a first end of the diode is electrically connected to a receiving electrode, and a second end of the diode is electrically connected to the pulse signal input end;

a gates of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, and a second pole of the second switch transistor is connected to a first pole of the third switch transistor, a gate of the third switch transistor is electrically connected to a scanning signal end, and a second pole of the third switch transistor is electrically connected to a signal reading end.

5. The ultrasonic recognition module according to claim 1, wherein the driving circuits respectively comprise a storage capacitor, a first switch transistor, a second switch transistor, and a third switch transistor; wherein, a first end of the storage capacitor is electrically connected to the receiving electrode, and a second ends of the storage capacitor is grounded;

a gate of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, a second pole of the second switch transistor is electrically connected to a first pole of the third switch transistor, a gate of the third switch transistor is electrically connected to a scanning signal end, and a second pole of the third switch transistor is electrically connected to a signal reading end.

6. A display device, comprising the ultrasonic recognition module according to claim 1.

7. The display device according to claim 6, wherein the receiving electrodes in a same row are located in a same receiving group, and the receiving electrodes in different rows are located in different receiving groups.

8. The display device according to claim 6, wherein the receiving electrodes in a same column are located in a same receiving group, and the receiving electrodes in different columns are located in different receiving groups.

9. The display device according to claim 6, wherein the plurality of driving circuits respectively comprise a diode, a first switch transistor, a second switch transistor, and a third switch transistor; wherein, a first end of the diode is electrically connected to a receiving electrode, and a second end of the diode is electrically connected to the pulse signal input end;

a gates of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, and a second pole of the second switch transistor is connected to a first pole of the third switch transistor, a gate of the third switch transistor is electrically connected to a scanning signal end, and a second pole of the third switch transistor is electrically connected to a signal reading end.

10. The display device according to claim 6, wherein the driving circuits respectively comprise a storage capacitor, a first switch transistor, a second switch transistor, and a third switch transistor; wherein, a first end of the storage capacitor is electrically connected to the receiving electrode, and a second ends of the storage capacitor is grounded;

a gate of the first switch transistor is electrically connected to a reset signal end, a first pole of the first switch transistor is electrically connected to the receiving electrode, and a second pole of the first switch transistor is electrically connected to the pulse signal input end; and a gate of the second switch transistor is electrically connected to the receiving electrode, a first pole of the second switch transistor is electrically connected to a power supply end, a second pole of the second switch transistor is electrically connected to a first pole of the third switch transistor, a gate of the third switch transistor is electrically connected to a scanning signal end, and a second pole of the third switch transistor is electrically connected to a signal reading end.

11. The display device according to claim 6, wherein the ultrasonic recognition module further comprising: a driving electrode disposed opposite to a film layer where the plurality of receiving electrodes are located, and a piezoelectric layer located between the driving electrode and the film layer where the plurality of receiving electrode is located, wherein the driving electrode and the piezoelectric layer are formed over an entire surface.

12. A driving method of the ultrasonic recognition module according to claim 1, comprising:
  providing multiple detection points by the ultrasonic recognition module, wherein each of the multiple detection points corresponds to the plurality of receiving groups, and one receiving group corresponds to only one detection point; and
  applying pulse signals to pulse signal input ends of the plurality of receiving groups corresponding to a same detection point by using the pulse signal input lines, wherein time points for loading the pulse signals by receiving groups that are at a same distance from the detection point are same, and time points for loading the pulse signals by receiving groups that are closer to the detection point are later than time points for loading the pulse signals by receiving groups that are far from the detection point.

13. The driving method of the ultrasonic recognition module according to claim 12, wherein the receiving electrodes located in a same row are a receiving group, or the receiving electrodes located in a same column are a receiving group.

14. The driving method of the ultrasonic recognition module according to claim 13, wherein simultaneously performing a ultrasonic detection on detection points corresponding to the receiving groups which do not spatially cross.

15. The driving method of the ultrasonic recognition module according to claim 13, wherein sequentially perform a ultrasonic detection is on detection points corresponding to the receiving groups which spatially cross.

16. The driving method of the ultrasonic recognition module according to claim 15, wherein the sequentially performing the ultrasonic detection on the detection points, comprises:
  receiving electrodes of the plurality of receiving groups corresponding to other detection points are in a floating state in response to that performing the ultrasonic detection one detection point.

17. The driving method of the ultrasonic recognition module according to claim 13, wherein every two adjacent receiving groups correspond to different detection points, and the receiving groups corresponding to different detection points are alternately arranged.

18. The driving method of the ultrasonic recognition module according to claim 17, wherein each detection point corresponds to an odd number of receiving groups, and a receiving group in a center location of the odd number of receiving groups is a first receiving group, receiving groups on both sides of the first receiving group are second receiving groups, the second receiving groups are symmetrically arranged along the first receiving group, and the detection point is located right above the first receiving group.

* * * * *